United States Patent
Vautin et al.

(10) Patent No.: US 11,012,775 B2
(45) Date of Patent: May 18, 2021

(54) AUDIO SYSTEM WITH LIMITED ARRAY SIGNALS

(71) Applicant: Bose Corporation, Framingham, MA (US)

(72) Inventors: Jeffery R. Vautin, Worcester, MA (US); Nicholas Lade, Waltham, MA (US); Muhammad Haris Usmani, Waltham, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/362,190

(22) Filed: Mar. 22, 2019

(65) Prior Publication Data
US 2020/0304911 A1    Sep. 24, 2020

(51) Int. Cl.
*H04R 3/04*    (2006.01)
*H03G 3/30*    (2006.01)
(Continued)

(52) U.S. Cl.
CPC ............ *H04R 3/04* (2013.01); *H03G 3/3005* (2013.01); *H04R 1/403* (2013.01); *H04R 3/12* (2013.01)

(58) Field of Classification Search
CPC ........ H03G 3/3005; H03G 5/025; H04R 3/04; H04R 1/403; H04R 3/1214; H04R 3/12; H04R 3/007; H04R 29/001
(Continued)

(56) References Cited

U.S. PATENT DOCUMENTS 8,229,137 B2 * 7/2012 Romesburg .............. H03G 7/08
                                                                      381/107
8,582,784 B2   11/2013 Minnaar
(Continued)

FOREIGN PATENT DOCUMENTS

EP    2706662 A2    3/2014
WO    2011085148 A1    7/2011

OTHER PUBLICATIONS

Invitation to Pay Additional Fees and, Where Applicable, Protest Fee, International Application No. PCT/US2020/022288, pp. 1-11, dated Jun. 15, 2020.
(Continued)

*Primary Examiner* — Disler Paul
(74) *Attorney, Agent, or Firm* — Bond, Schoeneck & King, PLLC

(57) ABSTRACT

An audio system, including at least one approximating circuit, the at least one approximating circuit configured to apply an approximated gain to the input signal, the least one approximating circuit outputting an approximated signal; a limiter configured to reduce a magnitude of the input signal by a gain determined by an amount the magnitude of the approximated filtered signal exceeds a predetermined threshold, the limiter outputting a limited input signal; a filter being respectively configured to receive the limited input signal and to respectively apply a filter gain, the filters outputting a plurality of filtered signals, wherein the approximated gain is substantially similar to the filter gain of one of the plurality of equalization filters; and a speaker array comprising a plurality of speakers, each speaker configured to receive a respective filtered signal of the plurality of filtered signals and to transduce the filtered signal to an audio signal.

20 Claims, 14 Drawing Sheets

(51) Int. Cl.
*H04R 1/40* (2006.01)
*H04R 3/12* (2006.01)

(58) Field of Classification Search
USPC ...... 381/55, 59, 120, 99, 102–104, 106–108
See application file for complete search history.

(56) References Cited

U.S. PATENT DOCUMENTS

| | | | | |
|---|---|---|---|---|
| 10,356,521 | B2* | 7/2019 | Lawrence | G10L 21/0272 |
| 2007/0025559 | A1* | 2/2007 | Mihelich | H04S 7/301 |
| | | | | 381/59 |
| 2014/0140535 | A1* | 5/2014 | Doy | H03G 9/025 |
| | | | | 381/98 |
| 2015/0019212 | A1* | 1/2015 | Nongpiur | G10L 21/0208 |
| | | | | 704/225 |
| 2016/0029143 | A1* | 1/2016 | Johnson | H04S 7/301 |
| | | | | 381/303 |
| 2016/0036402 | A1* | 2/2016 | Bongiovi | G10L 21/0205 |
| | | | | 381/107 |
| 2016/0307581 | A1* | 10/2016 | Salmela | G10L 21/034 |
| 2016/0344356 | A1* | 11/2016 | Grosche | G10L 19/26 |
| 2019/0158957 | A1* | 5/2019 | Breebaart | H04R 5/02 |

OTHER PUBLICATIONS

International Search Report and the Written Opinion of the International Searching Authority, International Application No. PCT/US2020/022288, pp. 1-18, dated Aug. 10, 2020.

* cited by examiner

AUDIO SYSTEM WITH LIMITED ARRAY SIGNALS

BACKGROUND

The present disclosure is generally related to audio systems with limited array signals.

SUMMARY

All examples and features mentioned below can be combined in any technically possible way.

In one aspect, an audio system includes at least one approximating circuit, the at least one approximating circuit configured to apply an approximated gain to an input signal, the least one approximating circuit outputting an approximated signal; a limiter configured to reduce a magnitude of the input signal by a gain determined by an amount the magnitude of the approximated signal exceeds a predetermined threshold, the limiter outputting a limited input signal; a filter configured to receive the limited input signal and to respectively apply a filter gain, the filter outputting a plurality of filtered signals, wherein the approximated gain is substantially similar to the filter gain; and a speaker array comprising a plurality of speakers, each speaker configured to receive a respective filtered signal of the plurality of filtered signals and to transduce the respective filtered signal to an audio signal.

In an example, the approximating circuit comprises a second filter.

In an example, the second filter is substantially identical to the filter that is configured to receive the limited input signal.

In an example, the second filter is an infinite impulse response filter.

In an example, the second filter is a minimum phase filter.

In an example, the audio system further includes a plurality of output limiters, each of the plurality of output limiters being configured to reduce a magnitude of a respective filtered signal of the plurality of filtered signals by a gain determined by an amount that the magnitude of the filtered signal exceeds a second predetermined threshold.

In an example, each of the plurality of output limiters is configured to apply to the respective filtered signal the greater of a gain determined by the amount that the magnitude of the respective filtered signal exceeds the second predetermined threshold and a gain applied by another limiter of the plurality of output limiters.

In an example, the audio system further includes a second limiter, wherein the first limiter is configured to reduce a magnitude of a first frequency band of the input signal, wherein the second limiter is configured reduce a magnitude of a second frequency band of the input signal.

In an example, the input signal is compressed by a compressor.

In an example, the approximating circuit and the limiter are configured to receive a second input signal, wherein the second input signal is compressed by a second compressor.

In an example, a compression applied to the input signal by the compressor is the same as a second compression applied to the second input signal by the second compressor.

In an example, the limiter is configured to reduce the magnitude of the input signal by a gain determined by the greater of the amount the magnitude of the approximated filtered signal exceeds a predetermined threshold and an amount a magnitude of the filtered signal exceeds a second predetermined threshold.

In an example, wherein the predetermined threshold and the second predetermined threshold are the same.

In an example, the audio system further includes a plurality of output limiters, each of the plurality of output limiters being configured to apply to a respective filtered signal of the plurality of filtered signals the greater of a gain determined by the amount the magnitude of the respective filtered signal exceeds the second threshold and a gain applied by another limiter of the plurality of output limiters.

In another aspect, an audio system, includes a filter being configured to receive an input signal, the filter outputting a plurality of output signals; a plurality of limiters each receiving a respective output signal of the plurality of output signals, wherein each of the plurality of limiters are configured to apply to the respective output signal the greater of a gain determined by an amount a magnitude of the respective output signal exceeds a threshold and a gain applied by another limiter of the plurality of limiters, each limiter of the plurality of limiters being configured to output a limited signal; and a speaker array comprising a plurality of speakers, each speaker of the plurality of speakers configured to receive a respective limited signal of the output limited signals and to transduce the limited signal to an audio signal.

In an example, a release time of each of the plurality of limiters has a length sufficient to permit a maximum delay in the filter to resolve.

In an example, the input signal is compressed by a compressor.

In an example, the filter is configured to receive a second input signal, wherein the second input signal is compressed by a second compressor.

In an example, a compression applied to the input signal by the compressor is the same as a second compression applied to the second input signal by the second compressor.

In an example, the audio system further includes a second plurality of limiters each receiving a respective output signal of the plurality of output signals, wherein each of the plurality of limiters are configured to apply to a first frequency band of the respective output signal the greater of a gain determined by an amount a magnitude of the respective output signal within the first frequency exceeds a threshold and a gain applied by another limiter of the plurality of limiters, each limiter of the plurality of limiters being configured to output a limited signal, wherein each of the second plurality of limiters are configured to apply to a second frequency band of the respective output signal the greater of a gain determined by an amount a magnitude of the respective output signal within the second frequency exceeds a threshold and a gain applied by another limiter of the second plurality of limiters, each limiter of the second plurality of limiters being configured to output a limited signal.

According to another aspect, an audio system includes a limiter configured to apply a gain to an input signal, the limiter being configured to output a limited signal; a filter being respectively configured to receive the limited signal and to apply a filter gain, the filter outputting a plurality of filtered signals, wherein the gain applied to the input signal is determined by an amount that a magnitude of one of the plurality of filtered signals exceeds a predetermined threshold; and a speaker array comprising a plurality of speakers, each speaker configure to receive a respective filtered signal of the plurality of filtered signals and to transduce the filtered signal to an audio signal.

In an example, the audio system further includes a plurality of output limiters, each of the plurality of output limiters being configured to reduce a magnitude of a respective filtered signal by a gain determined by the magnitude the filtered signal exceeds a second threshold.

In an example, each of the plurality of output limiters is configured to apply to the respective filtered signal the greater of a gain determined by the amount the magnitude of the respective filtered signal exceeds the second threshold and a gain applied by another limiter of the plurality of output limiters.

In an example, the input signal is compressed by a compressor.

In an example, the filter is configured to receive a second input signal, wherein the second input signal is compressed by a second compressor.

In an example, the audio system further includes a second limiter, wherein the first limiter is configured to reduce a magnitude of a first frequency band of the input signal, wherein the second limiter is configured reduce a magnitude of a second frequency band of the input signal.

The details of one or more implementations are set forth in the accompanying drawings and the description below. Other features, objects, and advantages will be apparent from the description and the drawings, and from the claims.

DETAILED DESCRIPTION

In an audio system with an array of speakers, each speaker will typically have an associated limiter designed to prevent the signal input to the speaker from exceeding a predetermined threshold. The predetermined threshold is normally set to prevent the input signal from overdriving the speaker. Because each speaker input (e.g., each output channel from the audio system) will have a respective gain, once a limiter limits the input to one speaker of the speaker array—the remaining speakers of the speaker array not being similarly limited—the relative gains of the speakers will be altered, undesirably "breaking" the speaker array. There exists a need in the art for limiting the signal input to the speaker array while preserving the relative gains of the speaker array when a particular input signal exceeds a limiter threshold.

Figure 1A:
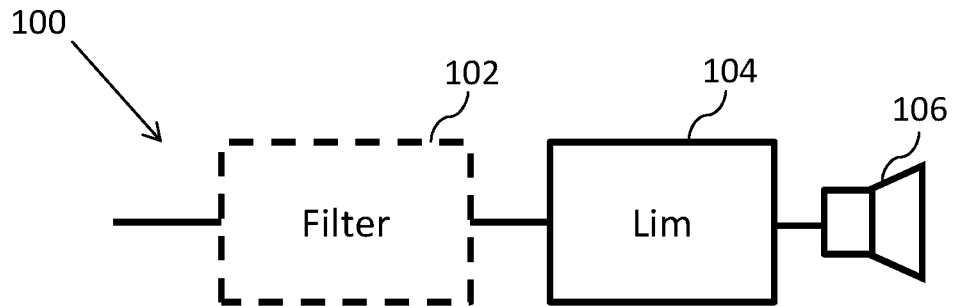
FIG. 1A is an audio system according to an example.

FIG. 1A shows a block diagram of an example audio system 100 that includes a filter 102, a limiter 104, and a speaker array 106. In the example shown, an input signal is received at the filter 102. The input signal may be from at least one sensor, such as a microphone, or other audio source, such as the output of a noise-cancellation system, and may be comprised of multiple input signals from a variety of sources, e.g., multiple microphones, multiple audio sources, etc.

In this example shown, the filter 102 performs two functions: expanding the input signal into multiple output channels and applying equalization filtering to the respective output channels in order to tune the output signals for a particular desired speaker array output. The equalization filtering will apply some gain to each output channel, adjusting the magnitude and phase of the input signal as a function of frequency. The magnitude and phase response of the equalization filtering will typically vary from output channel to output channel in order to achieve the desired audio mix within the predefined volume—although it is conceivable that the same equalization filtering will be applied two or more output channels. For example, one output channel may have reduced or increased gain in one frequency band and another output signal may have reduced or increased gain in another frequency band. Filter 102 will thus receive an input signal and output multiple filtered output signals from multiple channels (the output signals being the input signals having some filtering applied to them). Further, it should be understood that filter may receive more than one input signal, and may expand each received input signal into multiple channels (as shown, for example, in FIG. 11).

Filter 102 may be implemented as a single filter or a combination of filters. In an example, filter 102 may be an finite impulse response (FIR) filters, infinite impulse response (IIR) filters, or some combination of the two.

As mentioned, each output signal from filter 102 may be directed to a respective individual speaker of a speaker array 106 (the speaker array, in FIG. 1A, is represented as a single speaker for the sake of simplicity). The speakers of the speaker array 106 may be arranged within a predefined volume, such as, for example, the cabin of a vehicle. Each speaker receives the respective output signal and transduces it to an audio signal that is transmitted through the predefined space. Although speakers are referred to in this disclosure, it should generally be understood that each speaker may be implemented as any type of acoustic transducer.

The output signals may be output to limiter 104, disposed between the speaker array 106 and the filter 102, which limits each respective output signal to a particular threshold. More specifically, each limiter 104 will apply some value of gain reduction to attenuate the input signal, such that the signal will not exceed the threshold. The threshold may be defined to avoid overdriving each respective speaker of speaker array 106.

Figure 1B:
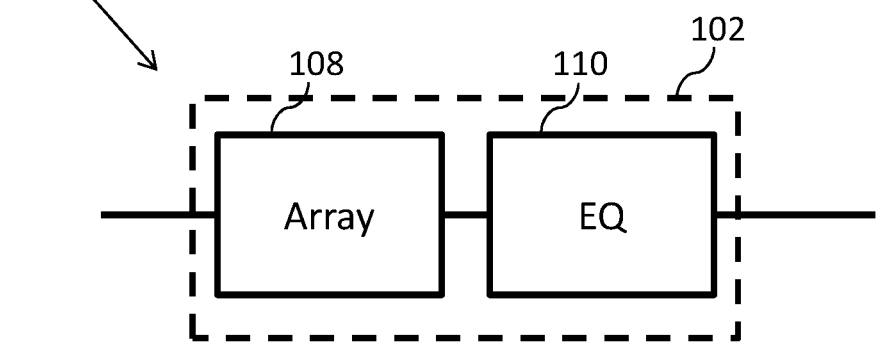
FIG. 1B is an audio system according to an example.

As shown in FIG. 1B, filter may be conceptualized as a combination of two filters: an array filter 108 and equalization filter 110. In an example, the array filter 108 receives the input signal and expands it two or more output channels. In various embodiments, the array filter may also add some gain and/or filtering to each channel. The equalization filter 110 adjusts the magnitude and phase of each channel as a function of frequency in order to tune the output to the speaker array 106, as described above.

Figure 1C:
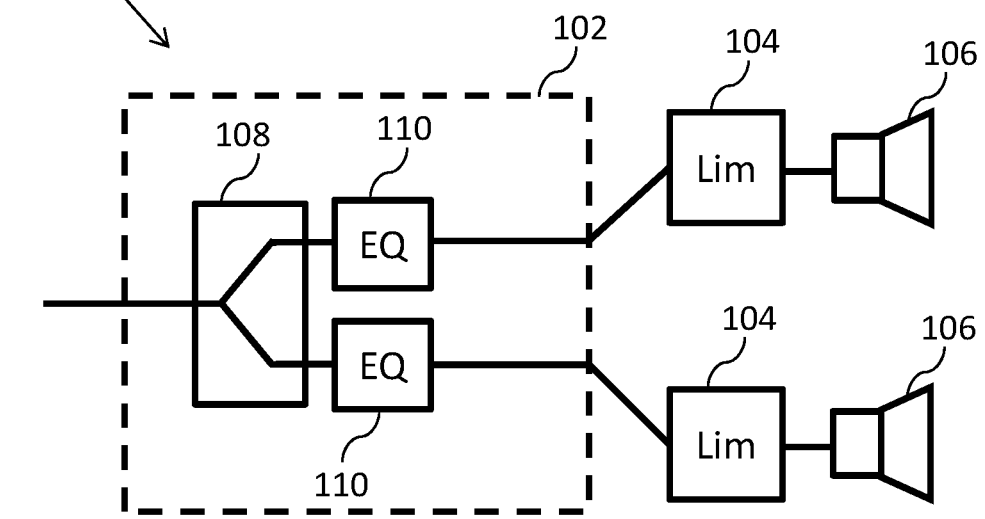
FIG. 1C is an audio system according to an example.

One implementation of audio system 100 is shown in FIG. 1C. In this example, array filter 108 is depicted expanding the input signal into two channels. Although two channels are depicted in the figures, the array filter 108 may expand the input signal to any number of channels. The equalization filters 110, here shown as each being associated with a respective array filter output channel, adjust the magnitude and phase of the associated output signal as a function of frequency and delay. Each equalization filter 110 outputs a signal to an associated limiter 104 and speaker of the speaker array 106.

Each respective limiter 104 will limit the magnitude of the output of the associated equalization filter 110 to within a threshold value.

The audio system of FIGS. 1A-1C and any of the audio systems described in this disclosure may be implemented with a nontransitory storage medium and processor. In an embodiment, the non-transitory storage medium may store program code that, when executed by processor, implements the various filters, limiters, compressors, etc. Alternatively the audio systems may be implemented hardware or firmware, or any combination of hardware, firmware, or software, as will be understood by a person of ordinary skill in the in conjunction with a review of this disclosure. For example, any audio system may be implemented by an FPGA, an ASIC, or other suitable hardware.

As described above, the output signals of filter 102 may, by design, have different magnitudes and phases due to the equalization filtering. As a result, one or more limiters 104 may reach the threshold before the others, so that a subset of the output signals are attenuated while the other output signal remains at the gain set by the equalization filter 108, altering the gain difference between the output signals, and, consequently, "breaking" the array output. To avoid limiting a subset of the output signals, the input signal may, instead, be limited. By limiting the input signal, each filter output signal will be reduced by the same gain, and thus the array is maintained.

This may be accomplished, for example, through the example audio-system 200 shown in FIG. 2. In this example, filter 102 is duplicated in a parallel side-chain. The duplicate filter 202, which is identical in processing to filter 102, receives and processes the input signal while the input to filter 102 is delayed by a delay 204. The output signals of the duplicate filter are received at a level detector 206 which determines whether any of the output signals exceed a predetermined threshold. The threshold of the level detector 206 may be selected to be comparable to the magnitude at which output limiters would be set, e.g., in FIG. 1C. The level detector 206 is in communication with input limiter 208, which applies the gain necessary to limit the magnitude of the input signal (having now passed the delay block) by at least the maximum amount that the output signals exceeded the threshold of the level detector. (The level detector, may, for example, set the threshold of the limiter such that appropriate gain reduction is applied to the input signal.) To the extent that two or more filter 202 output signals exceed the threshold at once, the limiter 208 gain is set according to the magnitude of the greater output signal. Stated differently, the gain reduction of the limiter 208 is determined by the maximum magnitude of all received filter 202 output signals.

Reducing the input signal by the magnitude that the output signal of filter 202 exceeds the threshold effectively lowers the gain of each output signal of filter 102 such that no single output signal of filter 102 exceeds the threshold of an output limiter (as shown, for example, in FIGS. 1A-1C). This obviates the need for output limiters, since the input signal has been limited at the input.

Figure 2A:
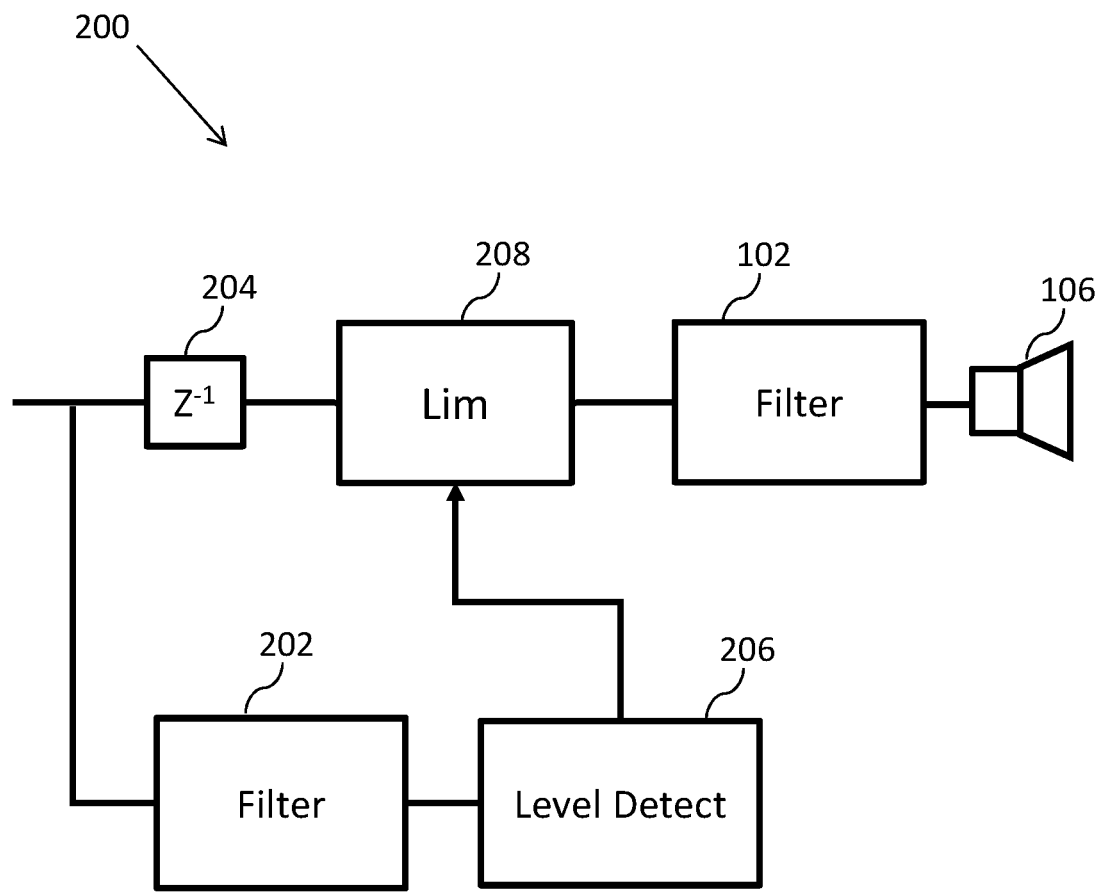
FIG. 2A is an audio system with a look-ahead filter according to an example.
Figure 2B:
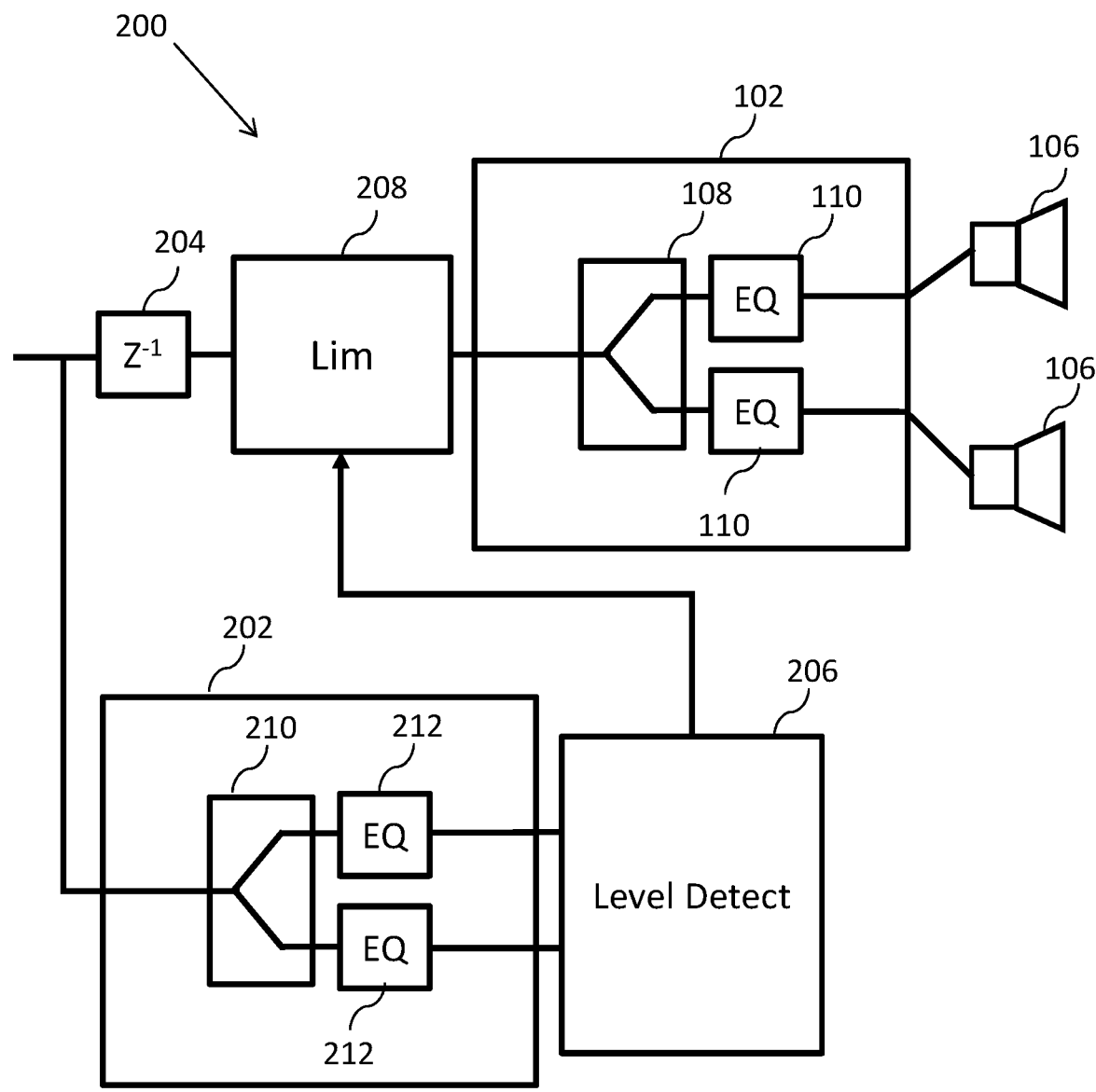
FIG. 2B is an audio system with a look-ahead filter according to an example.

An expanded example of FIG. 2A is shown in FIG. 2B, depicting constituent filters of filter 102 and duplicate filter 104: specifically, duplicate array filter 210 and duplicate equalization filters 212 reproduce the response of filter 102, and output two (or more) output signals to level detector 206.

The audio system 200 described in connection with FIGS. 2A and 2B, however, is computationally expensive, as it requires duplicating filter and, thus, performing the filtering twice. To avoid the computational complexity, various lower-cost audio systems may be implemented.

Figure 3:
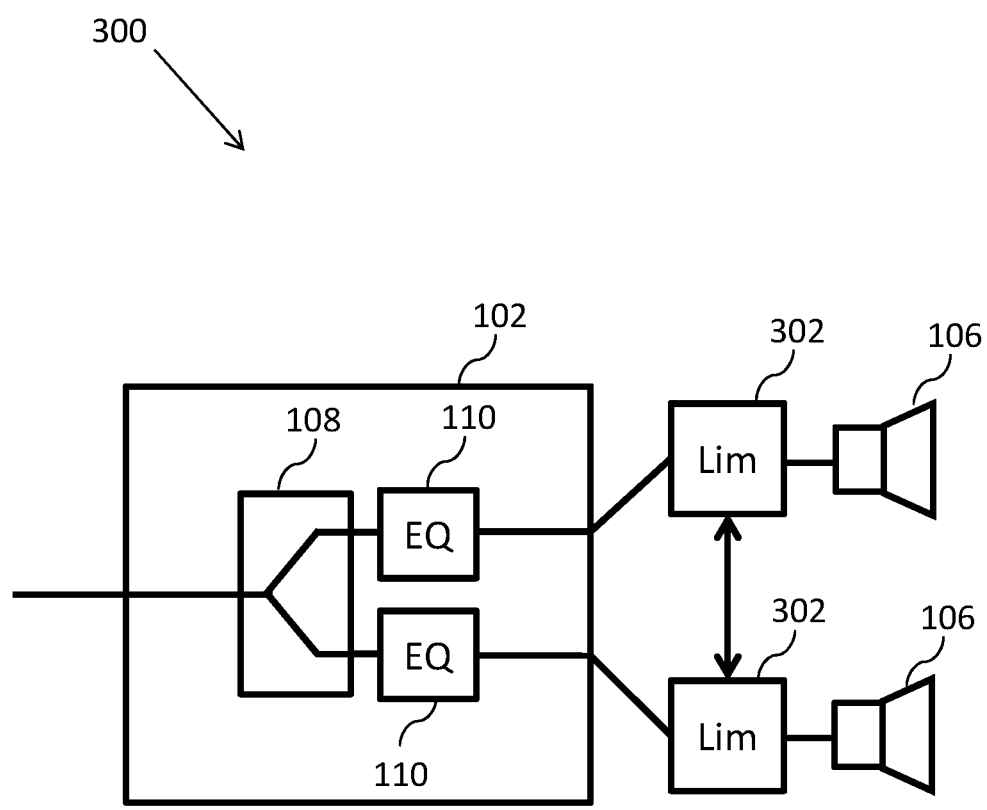
FIG. 3 is an audio system with coupled output limiters according to an example.

An example of such a lower-cost audio system is shown in FIG. 3. This example is similar to the example of FIG. 1C, however each output limiter 302 is coupled together, such that, when one limiter 302 exceeds the threshold and applies a gain reduction, the remaining limiters 302 apply the same gain reduction, maintaining the gain difference between the output channels. If multiple limiter 302 thresholds are exceeded at once, then all limiters 302 implement the maximum gain reduction implemented by any of the limiters. Each limiter 302 thus applies the greater of a gain based on the magnitude the received output signal of filter 102 exceeds a predetermined threshold or the gain applied by another limiter. In this way, the maximum gain applied by any limiter 302 is applied by all limiters 302.

This solution, however, suffers if any of the output signals of filter 102 are offset in time with respect to the others. Take, for example, a two-channel filter 102, one output channel of filter that has high gain and no delay and another output channel that has lower gain but is delayed by one sample. When the output channel with higher gain exceeds its threshold, by, for example, 10 dB, then a 10 dB reduction is applied to both channels. But because of the delay, the reduction for the delayed channel needs to be also delayed by one sample. However, because the delay is likely frequency-dependent, the array may still not be maintained.

To account for this, the limiters 302 may be configured to have a long release time (i.e., the period the limiter is increasing gain back to unity). The long release time ensures that all delays in any given channel are fully resolved before the limiters stop applying gain. The release time may be set, for example, to ensure that 20 ms after the peak signal, the gain has decayed toward unity by no more than 1 dB, where 20 ms is substantially more time than the delay in the filters. A long release time is not necessarily ideal, however, because the output channels will likely be limited, attenuating the array 106 output audio signal, for a longer period than necessary.

Figure 4A:
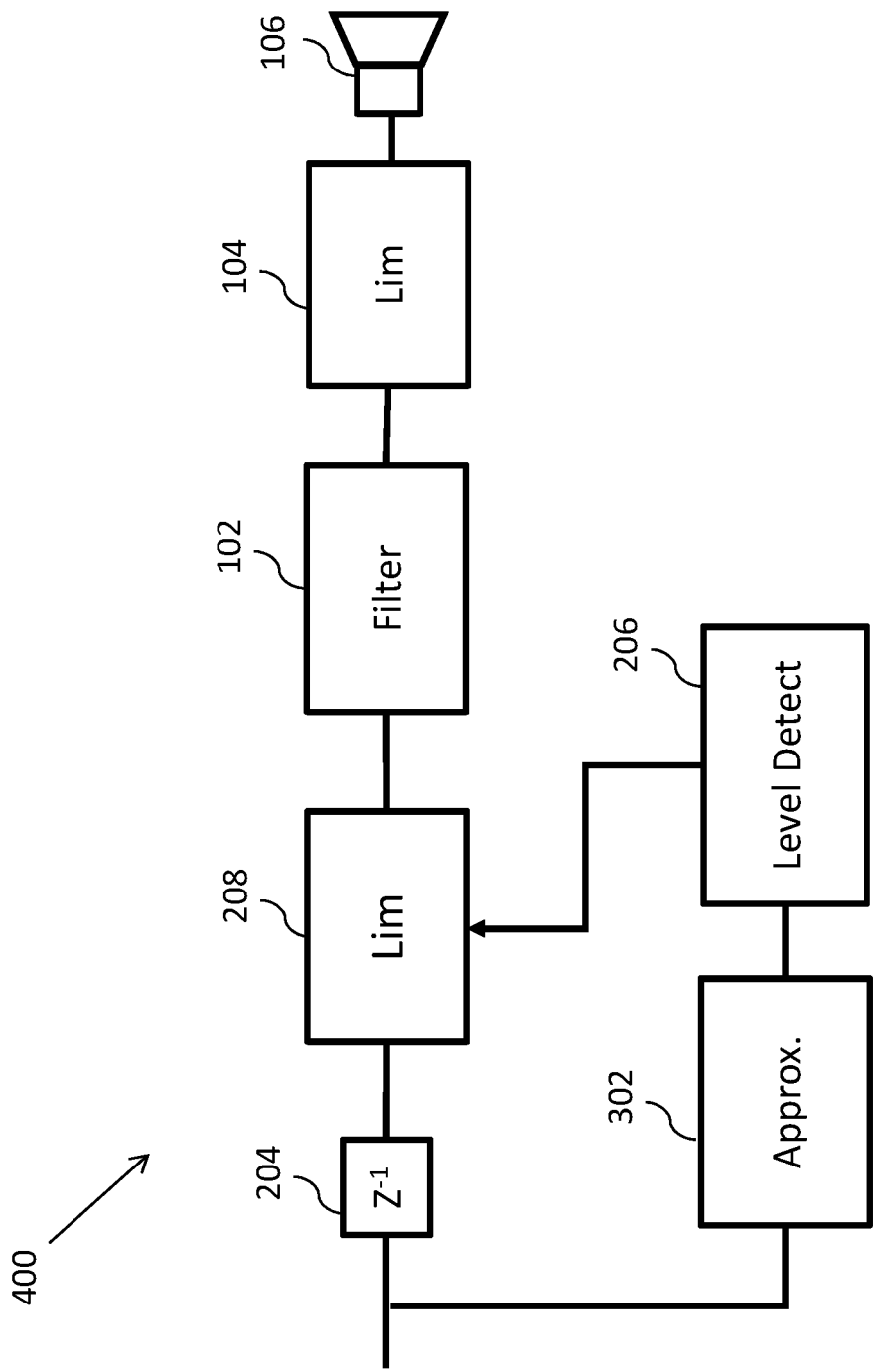
FIG. 4A is an audio system with a look-ahead approximation circuit according to an example.

A second example, audio system 400, is shown in FIG. 4A. This example is similar to the look-ahead design of the ideal solution depicted in FIG. 3A-3B, however, approximation circuitry 302 has been substituted in place of the duplicate filter 202. The approximation circuitry 302 approximates the filtering performed by the filter 102, but, in certain examples, demands fewer processing resources than the duplicate filter 202 and is thus more computationally efficient.

In the simplest example, the approximation circuitry 302 may apply a gain (e.g., with an amplifier, although other methods of applying a gain are contemplated) substantially equal (e.g., within 2 dB) to the maximum gain applied by filter 102. To be effective, the maximum gain is the largest gain applied between the output signal of filter 102 and the input signal received after the limiter 208. This solution will not approximate any frequency or phase characteristics of the filter 102, but will still largely approximate the maximum output magnitude of filter 102.

In more complex variants, a relatively cheap infinite-impulse-response (IIR) filter could be employed for approximation circuitry 203 to approximate the characteristics of filter 102 (here, "relatively cheap" means requiring less computational resources than filter). This IIR filter could, for example, be a minimum-phase filter that would capture the only magnitude response of the filter 102, but not the phase response, which generally presents the greatest computational complexity. Alternatively, an IIR filter that approximates the magnitude and phase response of the filter 102 may be used. To avoid adding too much complexity, the IIR filter could be limited in the number of stages implemented.

Approximation circuit 203 may also comprise an FIR filter. In an example, the FIR filter may be a minimum-phase filter that, like the minimum-phase IIR implementation, captures only the magnitude response of filter 102. Alternately, the FIR may be implemented in a manner substantially the same as filter 102 (and thus the same as duplicate filter 202). The FIR filter implementation may thus require fewer or the same amount of computational resources as filter 102.

Figure 4B:
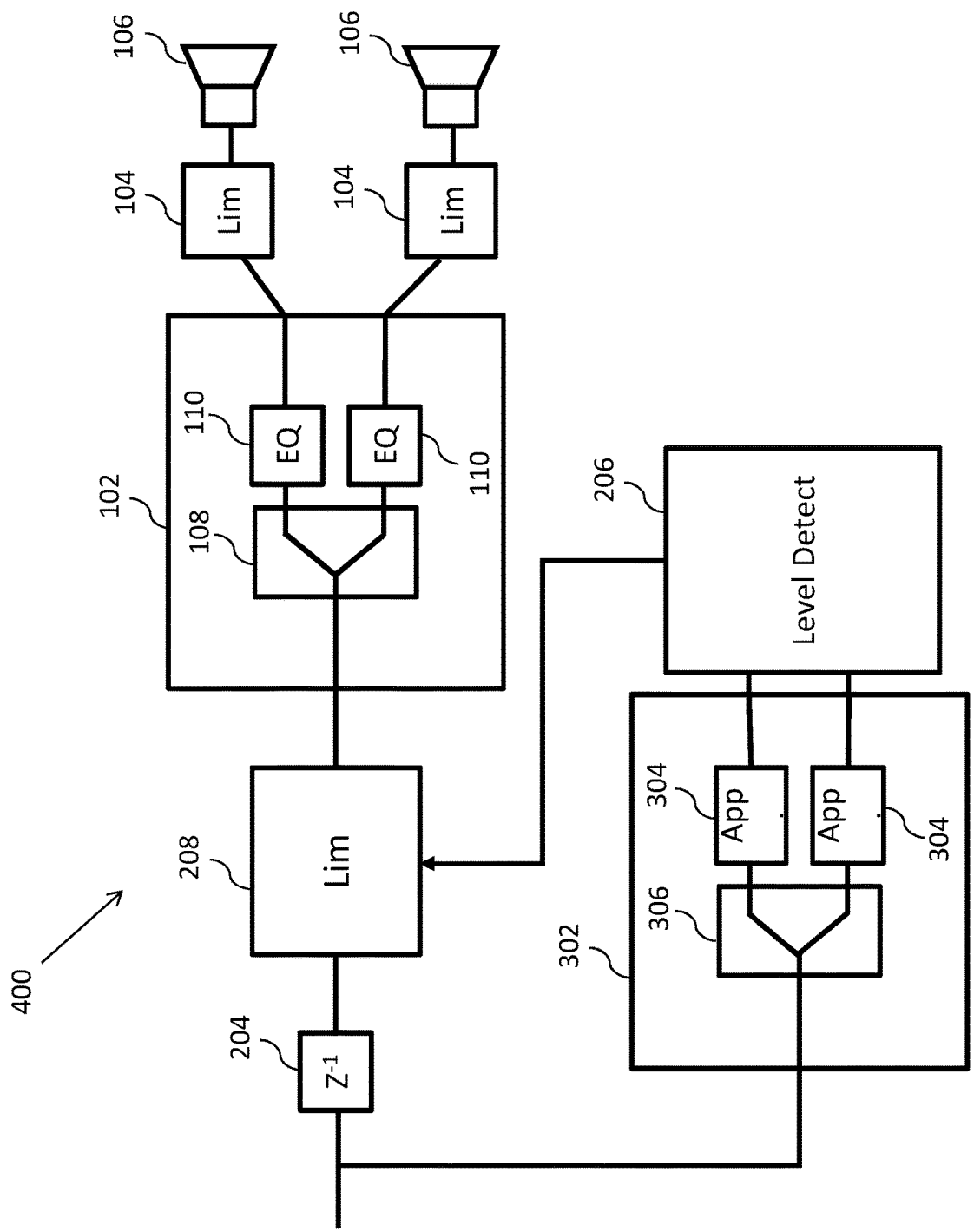
FIG. 4B is an audio system with a look-ahead approximation circuit according to an example.

An example expanded version of FIG. 4A is provided in FIG. 4B. As shown, equalization filters 110 are approximated with computationally-cheaper approximating IIR filters 304. Similarly, approximating array filter 306 may be implemented with cheaper IIR filters, thus reducing the computation demands made by audio system 400.

To simplify the IIR filter (minimum-phase or otherwise) only the filtering of the output signal of filter 102 having the greatest applied gain by filter 102 may be approximated. Stated differently, if the gain of the filtering applied to each output signal of filter 102 is larger for one output signal with respect to the others, only the filtering applied to that output signal may be approximated, since that output signal will likely exceed the threshold of an output limiter 104 before the others.

Because an approximation circuit 302 is used, the output signals may still overdrive the speaker array 106 in instances where the approximation fails to accurately capture the magnitude of the output signal. As a result, an output limiter 104 may still be used to limit such instances and prevent overdriving the speaker array 106. Of course, this means that, in such instances, the array would not be maintained. The quality of the approximation will dictate the frequency that the output limiter 104 is met.

Variations of audio system 400 are contemplated by this disclosure. For example, rather than duplicating array filter 108, array filter 108 may be disposed in front of the delay 204, thus providing duplicate input signals to limiter 208 and to the approximation circuitry 302. If the limiter 208 applies a gain reduction, it will be applied to both input signals equally, which are output to filter 102.

Figure 5A:
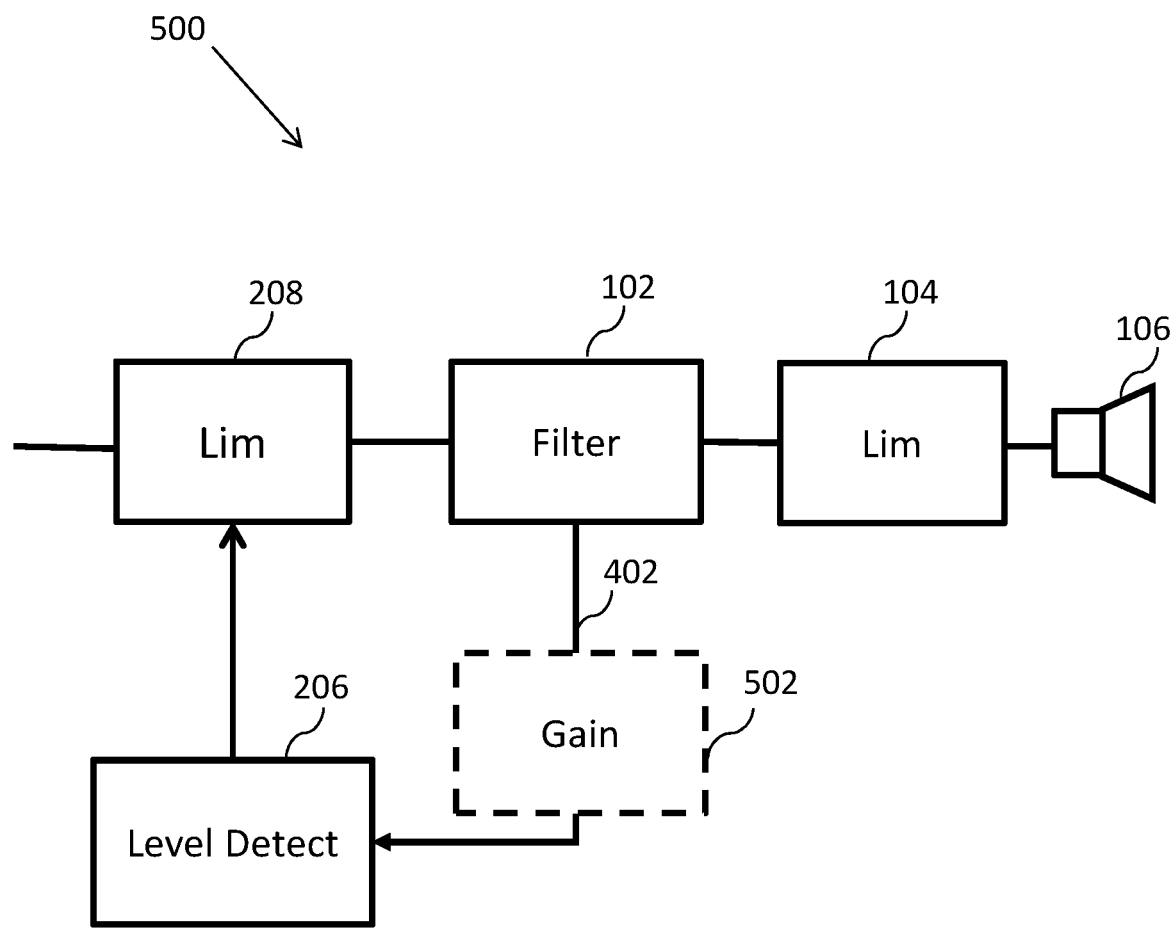
FIG. 5A is an audio system with a feedback loop according to an example.

A third example is shown in FIG. 5A. In this example, the threshold of the input limiter 208 is set according to feedback 402 received from the filter 102 at the level detector 206. The input limiter 208 applies the gain necessary to limit the magnitude of the input signal by at least the maximum amount that the output signals of filter 102 exceeded the threshold of the level detector 206. This example avoids processing-heavy side chains by setting the gain of input limiter 208 according to the actual output of filter 102.

This example, however, fails to catch rapid transients, as these will be output to the speakers 106 before the threshold of the limiter 208 can be set/changed. (The transients that will not be limited at the input by this example will be determined, at least in part, by the propagation delay through the filter 102 and feedback loop 402.)

To mitigate this, gain 502 may be added to the feedback loop 402 (e.g., with an amplifier disposed between the filter output and the level detector), artificially increasing the output of filter 102, resulting in an earlier gain reduction by the input limiter 208. Adding gain to the feedback loop 402, however, will result in applying limiting more than often necessary. Alternatively, and to the same result, the threshold of the limiter 208 may be lowered by a predetermined amount.

Figure 5B:
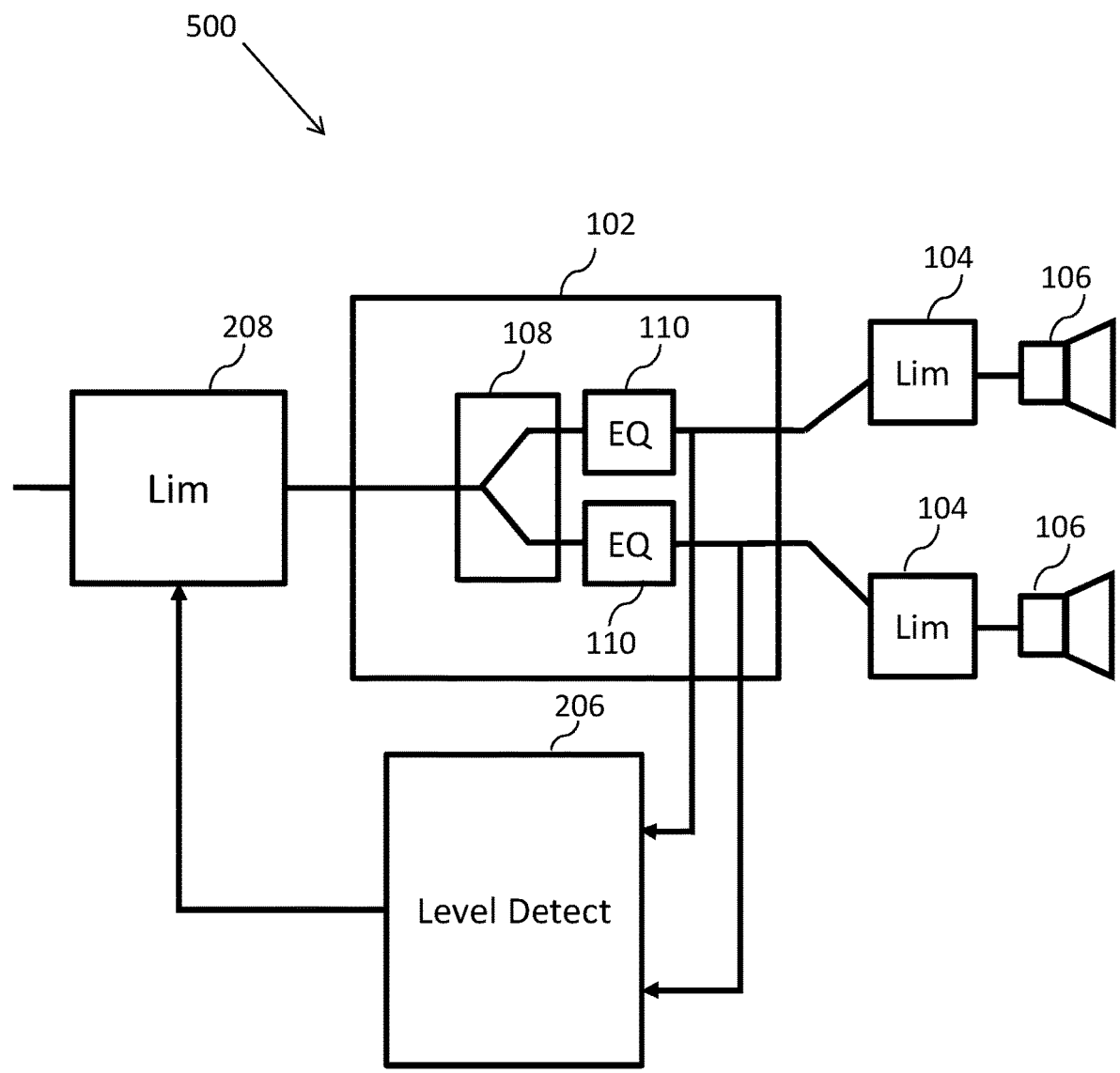
FIG. 5B is an audio system with a feedback loop according to an example.

An example expanded version of is depicted in FIG. 5B. As shown, the output signals from each output channel are provided to the level detector 206, which determines whether the magnitude of either output signal exceeds the threshold value. The limiter 208 then applies gain based on the amount the magnitude of either output signal exceeds the threshold. If both output signals exceed the threshold, the gain of limiter 208 is set according to the amount the greater of the two output signals exceeds the threshold.

Figure 6:
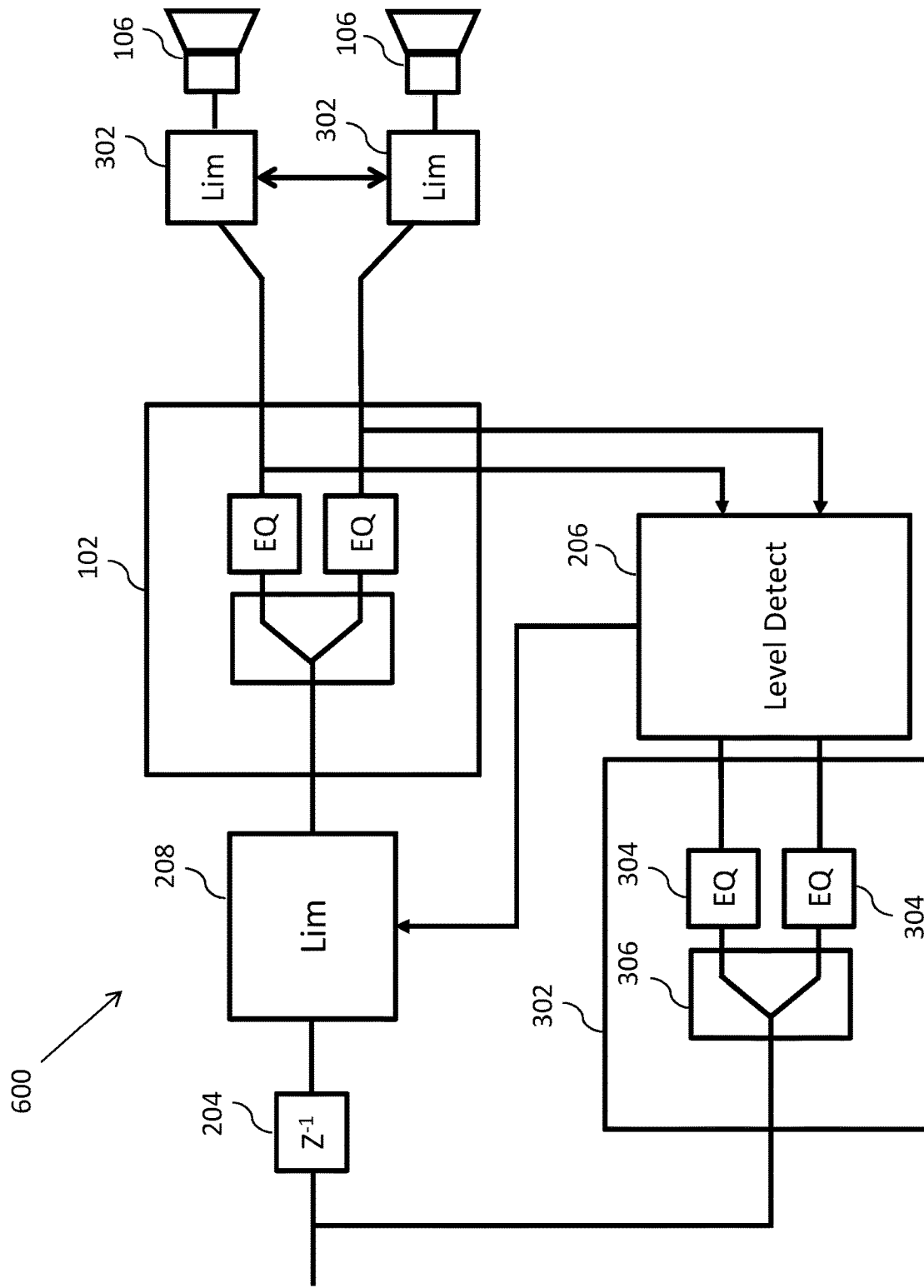
FIG. 6 is a combined audio system according to an example.

Any of the above-described examples may be combined together into a single solution, as shown in, for example, in FIG. 6. In this example, the coupled output limiters described in connection with FIG. 3, the low-cost approximation look-ahead filter described in connection FIGS. 4A-4B, and the feedback loop described in connection with FIGS. 5A-5B have been combined into a single system. Because both of the approximation circuit 302 and the filter 102 both output a signal to the level detector 206, the greatest magnitude signal from either approximation circuit 302 or filter 102 may be used to set the gain of limiter 208. It should be recognized that any two of the above-described audio systems may be combined together, rather than all three.

In addition, of the above-described solutions may be configured for multiband limiting. Multiband limiting employs multiple limiters, each receiving a particular frequency band of signal and is most useful when one frequency or band of frequencies receives more gain than others. For example, if a filter has high gain at high frequencies and low gain at low frequencies, a wideband input signal will reach the threshold of the limiter due to the high gain of the high frequencies, even though the low frequency filter output was not above the limiter threshold. To mitigate this, the filter outputs are divided across different frequency bands and only one band is input to a particular limiter. The frequency bands may be selected according the particular filter characteristics (e.g., grouped into high gain frequency bands and low or lower gain frequency bands). The granularity offered by the number of frequency bands and limiters employed may be balanced against the additional computational complexity added by duplicated limiters/filters.

Figure 7:
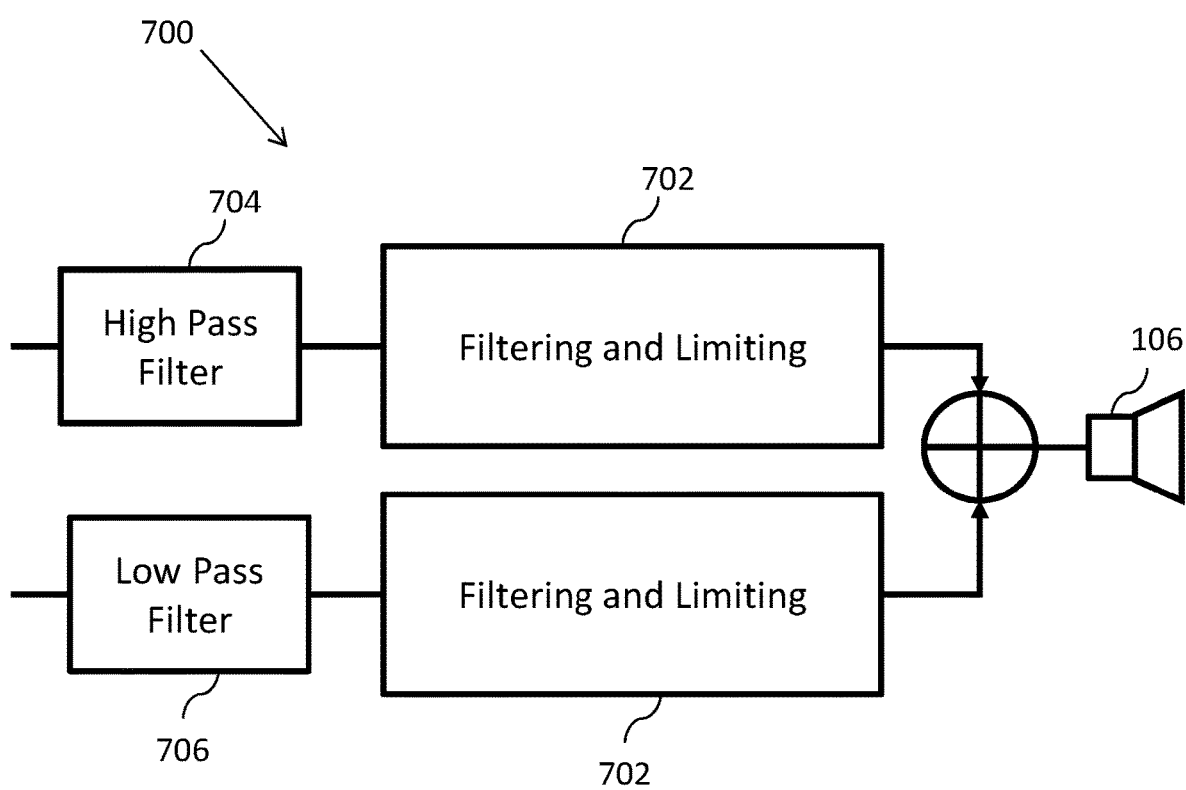
FIG. 7 is a multi-band limited audio system according to an example.

Multi-band limiting may be implemented in a number of ways. For example, as shown in FIG. 7 the filtering and limiting any of the above-described audio systems (shown collectively in FIG. 7 as filtering and limiting block 702) may be duplicated N-times (e.g., three times), each receiving a different frequency band (there may be some overlap between the bands), the outputs of each duplicated audio system being summed together and output to speaker array 106. For example, as shown in FIG. 7, a low-pass filter 704 may be employed at the input to one chain, to limit that audio system to one band, while a high-pass filter 706 may be employed at the input to another chain. It should be understood that the examples of low-pass 704 and high-pass filter 706 as used here (and in FIGS. 8-10) are merely provided as examples—the shape and cut-off frequency (or frequencies) of the input filters may be selected to achieve any desired multi-band limiting.

However, the example of FIG. 7 requires duplicating the filter 102 multiple times, which, as described above, is computationally expensive. Accordingly, the limiters 104, 208 of filtering and limiting 702 rather than the limiters 104, 302, 208 and filter 102, may be duplicated and the inputs/feedback signals to the duplicated limiters 104, 302, 208 may be constrained to certain frequency bands.

Figure 8:
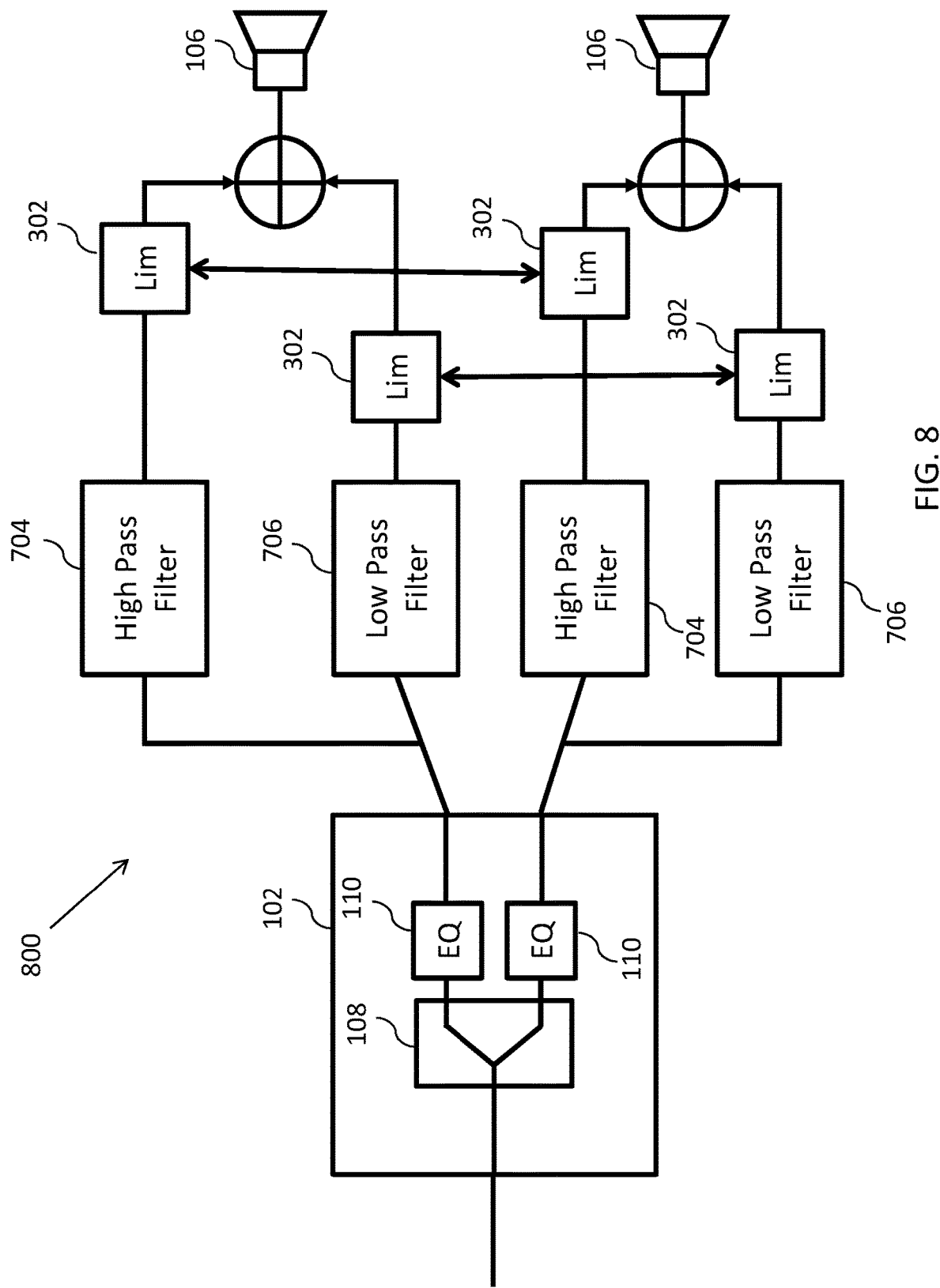
FIG. 8 is a multi-band limited audio system with coupled output limiters according to an example.

For example, FIG. 8 shows an example, audio system 800, of the filtering and limiting of FIG. 3 modified for multi-band limiting. As shown, filter 102 is not duplicated. Instead, each output channel is respectively input to a high-pass 704 and low-pass filter 706 (again, these filter types are merely provided as examples) each output from a high-pass 704 and low-pass filter 706 is fed to a respective limiter 302. Each limiter 302 associated with a particular filter output channel is summed together. Each limiter 302 associated with a particular frequency band is coupled together such that the same gain is applied to each. For example, if one limiter 302 receiving high-frequency outputs exceeds its threshold and applies some gain, the other limiter 302 receiving high-frequency output (of another channel) may apply the same gain in order to maintain the array, but the limiters 302 receiving the low-frequency outputs will not apply the same gain (unless, of course, one of their respective thresholds is met as well).

Figure 9:
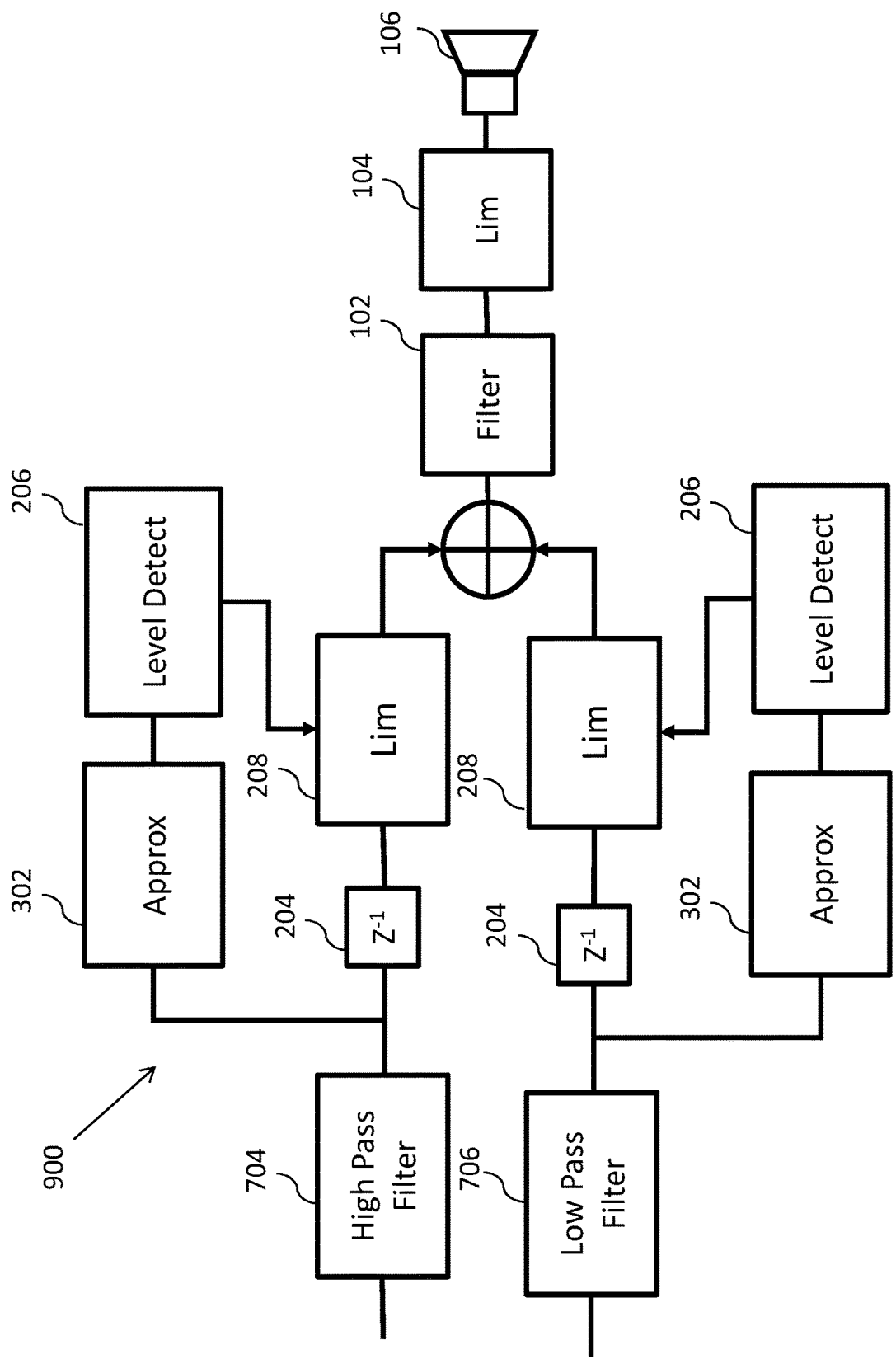
FIG. 9 is a multi-band limited audio system with a look-ahead approximation circuit according to an example.

FIG. 9 shows an example, audio system 900, of FIG. 4A modified for multi-band limiting as well. Again, the filter 102 is not duplicated, rather, the input signal is passed through a high pass filter 704 and low pass filter 706, which are situated in parallel. The output of the high pass filter 704 and low pass filter 706 are respectively input to duplicated side-chains, which compute whether the approximated signal for the particular band of frequencies exceeds the predetermined threshold and sets the gain of a respective duplicated limiter 208 accordingly. The limiters 208 each respectively receive the output of the input filter, and thus limit only the respective band for which their gain has been adjusted. The outputs of the limiters 208 are summed together and input to filter 102.

Figure 10:
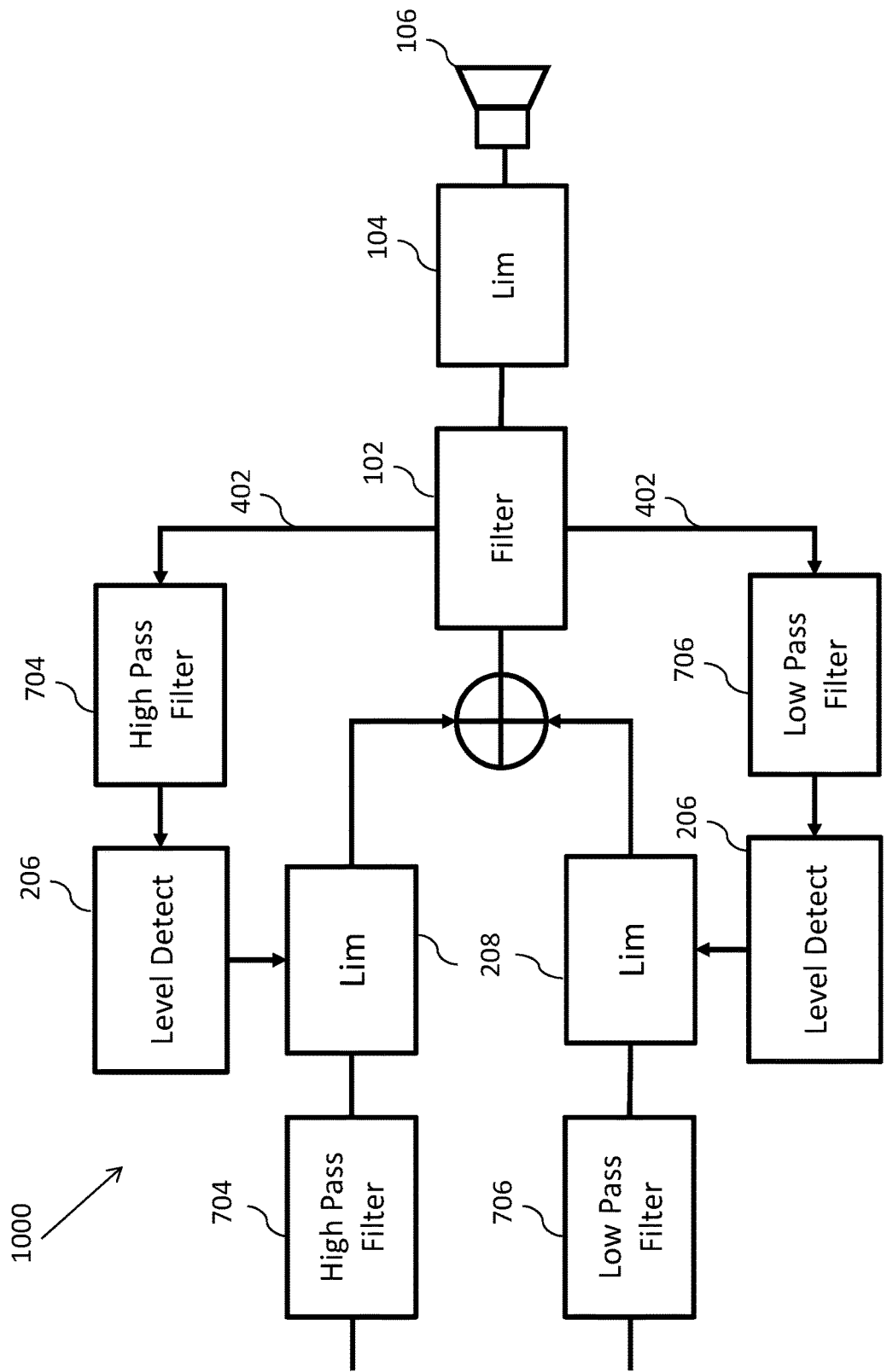
FIG. 10 is a multi-band limited audio system with feedback loop according to an example.

FIG. 10 shows an example, audio system 1000, of FIG. 5A modified for multi-band limiting. As shown, the input signal is received through one of input high-pass filter 704 or low pass filter 706 at the duplicated limiters 208. The gain applied by the limiters 208 is set by the feedback signal from filter 102, the feedback signal also being filtered (respectively by feedback high-pass filter 704 and low-pass filter 706) according to the input signal frequency band limiter 208 receives. This ensures that the limiter 208 will not respond to the magnitude of frequencies outside of the particular frequency band of the input signal the limiter receives at the input. The outputs of the duplicated limiters 208 are summed together and input to filter 102.

The above topologies depicted and described for multi-band limiting are merely provided as examples; each audio system could be modified for multi-band limiting differently in other examples. Further, each example may be further expanded for limiting any number of frequency bands: the two bands are merely provided as examples. Also, in each of the above multi-band limiting examples, there may be some overlap between the various frequency bands, but the bands are generally not coextensive.

Figure 11:
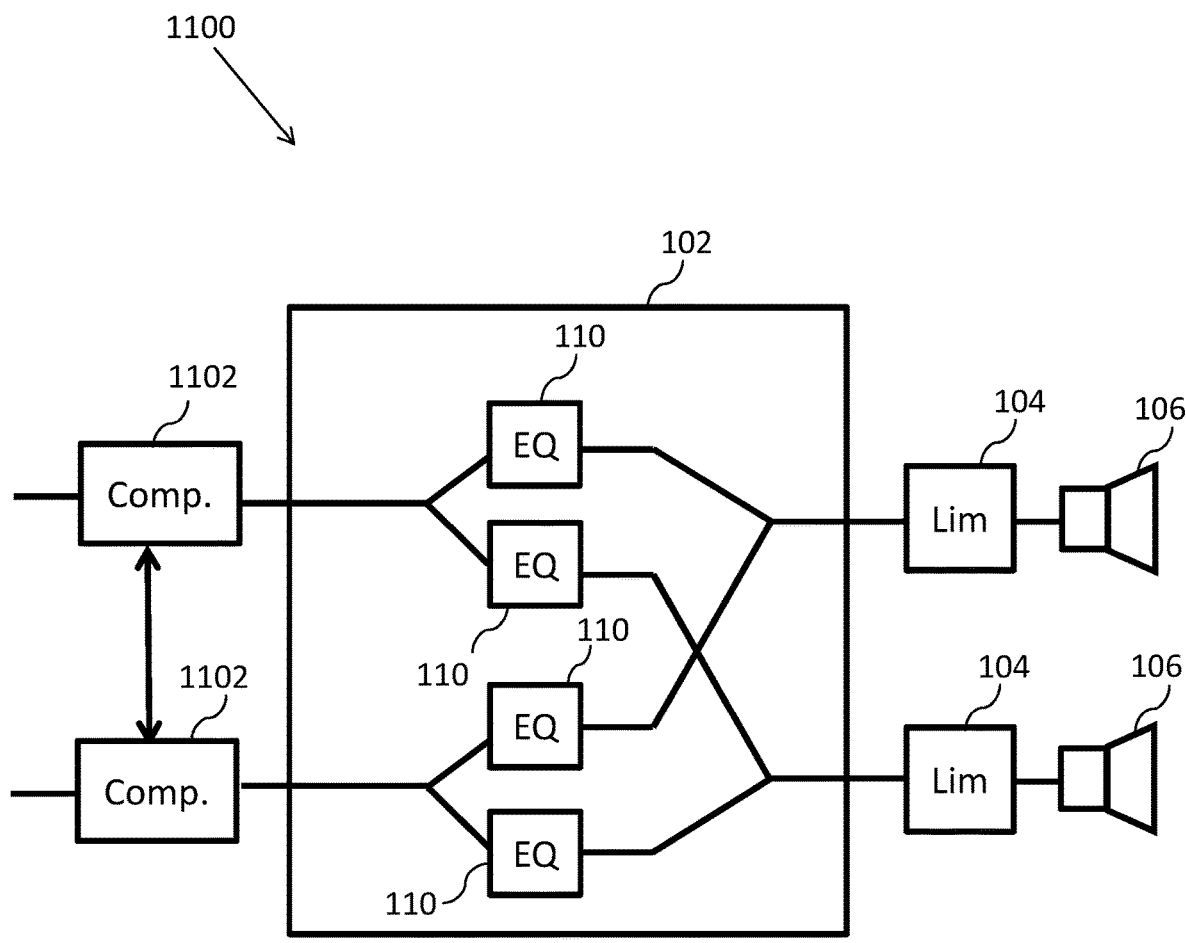
FIG. 11 is an audio system having multiple inputs and soft-knee input compressors according to an example.

As shown in FIG. 11, and as mentioned above, filter may receive multiple inputs and expand each input into two or more channels, each channel being input to a respective speaker of the speaker array. This, however, may result in a configuration in which a limiter 104, associated with one speaker, is more sensitive to one input signal than the other. For example, if, in the example of FIG. 11, one filter 110 applies a maximum gain factor of two, while the remaining filters 110 apply a maximum gain factor of one (these gain factors may, for example, be frequency and delay dependent), the limiter 104 receiving the signal from the filter 110 with the gain factor of two is more likely to reach the limiter threshold as a result of one input signal than the other.

To compensate for this, coupled compressors 1102 may be added to each respective input signal. Each compressor 102 will apply some compression (e.g., attenuate the magnitude of the signal) to the respective input signal. The compression curve may be tailored so that an input signal does not reach the limiter 104 threshold as frequently. The compressors 102 may each be configured to apply the same compression, so that the relative gains of the output channels of filter 102 are not affected by the compression.

Although two compressors 102 are shown in FIG. 11, each compressing a respective input signal, it should be understood that any number of compressors 102 may be associated with any number of inputs. In an example, a single input signal may be compressed by a single compressor 102. Furthermore, in an alternate example (when multiple compressors 102 are used with multiple respective inputs), each compressor 102 may respectively apply different compression curves, rather than the same compression curve to each respective input signal.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

The invention claimed is:

1. An audio system, comprising:
   at least one approximating circuit, the at least one approximating circuit configured to apply an approximated gain to an input signal, the least one approximating circuit outputting an approximated signal;
   a limiter configured to reduce a magnitude of the input signal by a gain determined by an amount that the magnitude of the approximated signal exceeds a predetermined threshold, the limiter outputting a limited input signal;
   a filter configured to receive the limited input signal and to respectively apply a filter gain, the filter outputting a plurality of filtered signals, wherein the approximated gain is substantially similar to the filter gain; and
   a speaker array comprising a plurality of speakers, each speaker configured to receive a respective filtered signal of the plurality of filtered signals and to transduce the respective filtered signal to an audio signal.

2. The system of claim 1, wherein the approximating circuit comprises a second filter.

3. The system of claim 2, wherein the second filter is substantially identical to the filter that is configured to receive the limited input signal.

4. The system of claim 2, wherein the second filter is an infinite impulse response filter.

5. The system of claim 2, wherein the second filter is a minimum phase filter.

6. The system of claim 1, further comprising a plurality of output limiters, each of the plurality of output limiters being configured to reduce a magnitude of a respective filtered signal of the plurality of filtered signals by a gain determined by an amount that the magnitude of the filtered signal exceeds a second predetermined threshold.

7. The system of claim 6, wherein each of the plurality of output limiters is configured to apply to the respective filtered signal the greater of a gain determined by the amount that the magnitude of the respective filtered signal exceeds the second predetermined threshold and a gain applied by another limiter of the plurality of output limiters.

8. The system of claim 1, further comprising a second limiter, wherein the first limiter is configured to reduce a magnitude of a first frequency band of the input signal, wherein the second limiter is configured reduce a magnitude of a second frequency band of the input signal.

9. The system of claim 1, the input signal is compressed by a compressor.

10. The system of claim 1, wherein the limiter is configured to reduce the magnitude of the input signal by a gain determined by the greater of the amount the magnitude of the approximated filtered signal exceeds a predetermined threshold and an amount a magnitude of the filtered signal exceeds a second predetermined threshold.

11. The system of claim 10, further comprising a plurality of output limiters, each of the plurality of output limiters being configured to apply to a respective filtered signal of the plurality of filtered signals the greater of a gain determined by the amount the magnitude of the respective filtered signal exceeds the second threshold and a gain applied by another limiter of the plurality of output limiters.

12. An audio system, comprising:
    a filter being configured to receive an input signal, the filter outputting a plurality of output signals, wherein the input signal, received by the filter, is compressed by a compressor;
    a plurality of limiters each receiving a respective output signal of the plurality of output signals, wherein each of the plurality of limiters are configured to apply to the respective received signal the greater of a gain reduction determined by an amount a magnitude of the respective signal exceeds a threshold and a gain reduction applied by another limiter of the plurality of limiters, each limiter of the plurality of limiters being configured to output a limited signal; and
    a speaker array comprising a plurality of speakers, each speaker of the plurality of speakers configured to receive a respective limited signal of the output limited signals and to transduce the limited signal to an audio signal.

13. The system of claim 12, wherein a release time of each of the plurality of limiters has a length sufficient to permit a maximum delay in the filter to resolve.

14. The system of claim 12, wherein the filter is configured to receive a second input signal, the second input signal is compressed by a second compressor, wherein each of the plurality of output signals comprises a component from the input and a component from the second input, wherein the compressor applies a first compression to the input signal and the second compressor applies a second compression to the second input signal, the first compression and the second compression being the same.

15. The system of claim 12, further comprising a second plurality of limiters each receiving a respective output signal of the plurality of output signals,
    wherein each of the plurality of limiters are configured to apply to a first frequency band of the respective output signal the greater of a gain reduction determined by an amount a magnitude of the respective output signal within the first frequency exceeds a threshold and a gain reduction applied by another limiter of the plurality of limiters, each limiter of the plurality of limiters being configured to output a limited signal,
    wherein each of the second plurality of limiters are configured to apply to a second frequency band of the respective output signal the greater of a gain reduction determined by an amount a magnitude of the respective output signal within the second frequency exceeds a threshold and a gain reduction applied by another limiter of the second plurality of limiters, each limiter of the second plurality of limiters being configured to output a limited signal.

16. An audio system, comprising:
a limiter configured to apply a gain reduction to an input signal, the limiter being configured to output a limited signal;
a filter being configured to receive the limited signal and to apply a filter gain, the filter outputting a plurality of filtered signals, wherein the gain reduction applied to the input signal is determined by an amount that a magnitude of the greatest of the plurality of filtered signals exceeds a predetermined threshold; and
a speaker array comprising a plurality of speakers, each speaker u to receive a respective filtered signal of the plurality of filtered signals and to transduce the filtered signal to an audio signal.

17. The system of claim 16, further comprising a plurality of output limiters, each of the plurality of output limiters being configured to reduce a magnitude of a respective filtered signal by a gain determined by the magnitude the filtered signal exceeds a second threshold.

18. The system of claim 17, wherein each of the plurality of output limiters is configured to apply to the respective filtered signal the greater of a gain determined by the amount the magnitude of the respective filtered signal exceeds the second threshold and a gain applied by another limiter of the plurality of output limiters.

19. The system of claim 16, wherein the input signal is compressed by a compressor.

20. The system of claim 16, further comprising a second limiter, wherein the first limiter is configured to reduce a magnitude of a first frequency band of the input signal, wherein the second limiter is configured reduce a magnitude of a second frequency band of the input signal.

* * * * *